(12) United States Patent
Chan

(10) Patent No.: US 7,540,159 B2
(45) Date of Patent: Jun. 2, 2009

(54) SUPERCONDUCTING MAGNET TRANSPORT METHOD AND SYSTEM

(75) Inventor: Peter Chan, Hartland, WI (US)

(73) Assignee: GE Medical Systems, Inc, Waukesha, WI (US)

( * ) Notice: Subject to any disclaimer, the term of this patent is extended or adjusted under 35 U.S.C. 154(b) by 1209 days.

(21) Appl. No.: 10/723,793

(22) Filed: Nov. 26, 2003

(65) Prior Publication Data

US 2005/0109043 A1 May 26, 2005

(51) Int. Cl.
*F17C 3/08* (2006.01)
*F17C 13/08* (2006.01)

(52) U.S. Cl. .......................................... 62/45.1; 62/53.2

(58) Field of Classification Search ................. 62/45.1, 62/47.1, 48.2, 53.2
See application file for complete search history.

(56) References Cited

U.S. PATENT DOCUMENTS

| | | | | | |
|---|---|---|---|---|---|
| 2,766,439 | A | * | 10/1956 | Palm ....................... | 123/41.15 |
| 3,919,852 | A | * | 11/1975 | Jones ................................ | 62/7 |
| 4,186,562 | A | * | 2/1980 | Tyree, Jr. ........................ | 62/62 |
| 4,492,090 | A | * | 1/1985 | Laskaris ...................... | 62/50.7 |
| 5,050,387 | A | * | 9/1991 | Bruce ............................. | 62/60 |
| 5,419,143 | A | * | 5/1995 | Leonard et al. .............. | 62/51.1 |
| 6,317,618 | B1 | * | 11/2001 | Livni et al. .................. | 600/410 |
| 6,566,875 | B1 | * | 5/2003 | Hasson et al. ............... | 324/309 |
| 6,679,071 | B1 | * | 1/2004 | Storey et al. .................. | 62/126 |
| 6,938,654 | B2 | * | 9/2005 | Gershtein et al. ............ | 141/231 |
| 7,193,512 | B1 | * | 3/2007 | Coulthard .................... | 340/531 |
| 2002/0166326 | A1 | * | 11/2002 | Giesy et al. .................. | 62/48.1 |
| 2004/0020236 | A1 | * | 2/2004 | Vince et al. .................. | 62/434 |
| 2005/0016198 | A1 | * | 1/2005 | Wowk et al. .................. | 62/371 |
| 2005/0055237 | A1 | * | 3/2005 | Schmidtberg et al. ......... | 705/1 |

* cited by examiner

*Primary Examiner*—William C Doerrler
(74) *Attorney, Agent, or Firm*—Fletcher Yoder

(57) ABSTRACT

According to one embodiment, the present technique provides a method of transporting a cryogenic device between first and second facilities. The exemplary method includes actively maintaining cryogen in the device within desired parameters. According to another embodiment, the present technique provides a portable resource supply, which provides resources to a cryogenic imaging device during transportation. Advantageously, the portable supply unit may actively maintain cryogen in the imaging device within desired parameters. Moreover, the portable supply unit may reduce the likelihood of a loss of cryogen and a loss of superconductivity in the imaging device. Furthermore, the present technique provides a maintenance system for cryogenic imaging devices. As one example, the maintenance system may include an intermediate facility having resources for maintaining a cryogenic imaging device during transportation thereof. That is, the intermediate facility may maintain the cryogenic imaging device within desired operating parameters, such as a superconductive state, once it has left a manufacturing facility and prior to its arrival at a destination facility, such as a medical imaging center.

44 Claims, 8 Drawing Sheets

SUPERCONDUCTING MAGNET TRANSPORT METHOD AND SYSTEM

BACKGROUND OF THE INVENTION

The present technique relates to superconducting magnet systems and, more particularly, to systems for handling such superconducting magnets, particularly during transportation, servicing, and installation.

A number of important applications exist for superconductive magnet systems. These include imaging systems, as for medical imaging, as well as spectrometry systems, typically used in materials analysis and scientific research applications. The present technique relates to management of cryogenically cooled superconductive magnets, and particularly to the servicing of such systems. Although reference is made throughout the following discussion to imaging systems, it should be borne in mind that the technique is applicable to a range of systems that utilize cryogenically cooled superconducting magnets.

Imaging devices are omnipresent in typical medical environments. Medical practitioners, such as physicians, may employ medical imaging devices to diagnose patients. Imaging devices, such as Magnet Resonance Imaging (MRI) devices and Nuclear Magnetic Resonance (NMR) devices, produce detailed images of a patient's internal tissues and organs, thereby mitigating the need for invasive exploratory procedures and providing valuable tools for identifying and diagnosing disease and for verifying wellness.

Typical MRI and NMR devices develop diagnostic images by affecting gyro-magnetic materials within a patient via controlled gradient magnetic fields and radiofrequency pulses in the presence of a main magnetic field developed by a superconductive magnet. During an MRI exam, a main magnetic field of upwards of two Tesla may be necessary to produce vivid images. Typically, superconductive electromagnets comprise loops of coiled wire, which are continuously bathed in a cryogen, such as liquid helium, at temperatures near absolute zero—approximately at −4K or −271C. When cooled to such extreme temperatures, the coiled wire becomes superconductive, i.e., the electrical resistance of the wire falls to essentially zero, enhancing the field strength without requiring significant energy input for continued operation. Advantageously, superconductive electromagnets reduce the electrical load requirements for producing the desired magnetic fields, thereby making the MRI system more economical to operate.

Cryogenic liquids, such as liquid helium, however, are relatively expensive to produce and maintain. Moreover, because of its low boiling point, liquid helium is a volatile liquid that transitions into a gaseous phase at relatively low temperatures. Accordingly, to conserve helium, typical MRI devices include a cryogen cooling system, which recondenses volatilized helium back into its liquid phase. That is, the helium is maintained in a sealed helium vessel that provides gaseous helium to the cooling system and receives liquid helium from the cooling system in a closed loop process.

However, from time to time, the cryogen cooling system may require maintenance and/or replacement. For example, the performance of the cooling system components may degrade, thereby reducing the efficacy of the cooling system. Moreover, leaks within the helium vessel and/or cooling system, again for example, may also reduce the efficacy of the cooling system. During maintenance, it may become necessary to disengage the cooling system and/or deactivate the MRI devices, events that are to be avoided. If the cooling system is off-line or not cooling effectively, more of the liquid helium may begin to volatilize, leading to an increase of pressure in the helium vessel. To prevent adverse effects due to the increased pressure, traditional MRI devices may relieve pressure by venting some of the gaseous helium to the atmosphere. The conversion of liquid helium to its gaseous state is generally known in the industry as "boil-off," and, venting of the gas leads to permanent loss expensive cryogen, requiring periodic refilling of the system.

To at least partially remedy these drawbacks of traditional systems, approaches have been developed for cooling superconductive magnets that are sometimes referred to as "zero boil-off" systems. In such systems a refrigeration system or "cold head" essentially runs continuously to recondense vaporized cryogen. An electric heater in the vessel then heats the cryogen to maintain a desired pressure level, thereby preventing the vessel pressure from falling below a desired level that could result in drawing atmospheric gases into the vessel. A balance is maintained between cooling and heating components that can be continuously monitored.

Traditionally, the maintenance of cooling systems in MRI devices is a reactive process. That is, technicians are generally called when, for example, image quality has been affected, a critical indicator has activated, and/or the system is no longer operable. For example, a typical system may generate a service call when a low level of cryogen is detected due to venting or leaks in the system. In addressing concerns reactively, the repair time and/or off-line periods may be longer than desired. For example, certain parts and/or technicians may not be immediately available, leading to longer than necessary downtimes (i.e., off-line time). Moreover, periods of reactive maintenance may not coincide with already scheduled routine maintenance procedures, leading to duplicative downtimes for the MRI device. Similarly, when substantial quantities of cryogen are required, very significant costs may be incurred in refilling the serviced system.

Similar problems exist even prior to the time such magnets are placed in operation. For example, magnets are typically built and tested in a controlled factory environment, then at least partially disassembled from other support equipment for shipping. Current procedures for building, testing and shipping superconductive magnets do not, however, adequately accommodate boil-off or servicing needs. In much the same way, mobile MRI systems and systems where communications infrastructures are less available pose particular challenges beyond those of traditional fixed locations in hospitals. Such challenges include cryogen monitoring and servicing, but also location and identification of the systems, and communication of relevant parameter data to a monitoring or service-coordinating location.

Accordingly, there is a need for an improved technique for transporting cryogen cooling systems. Particularly, there is a need for a technique that reduces the adverse effects of transportation of superconducting magnets and cryogenic cooling systems.

BRIEF DESCRIPTION OF THE INVENTION

The present technique provides a novel approach to transport, service and installation of cryogenic cooling systems and magnets designed to respond to such needs. According to one embodiment, the present technique provides a method of transporting a device having cryogen from a first facility to a second facility. By way of example, the method may be applied during the transportation of a medical imaging device, such as an MRI scanner, from the manufacturer's facility to a medical imaging facility. The exemplary method includes actively maintaining the cryogen in the device during transportation of the device.

According to another embodiment, the present technique provides a system for use during transportation of an imaging device from a first facility to a second facility. The exemplary system comprises a third facility located and an intermediate point on a route of travel between the first and second facility. Additionally, in the exemplary system, the third facility may be configured to maintain cryogen in the imaging device within predetermined parameters. By way of example, the third facility may be a facility is located on a route of travel between a manufacturer's factory and the medical imaging center.

According to another embodiment, the present technique provides an apparatus for use with a device having cryogen and a cryogen cooling system. The apparatus may provide resources to maintain the cryogen in an imaging device. For example, the apparatus may provide power to the cooling system to maintain the cryogen within predetermined parameters during transportation of the device from a first facility to a second facility.

DETAILED DESCRIPTION OF SPECIFIC EMBODIMENTS

Figure 1:
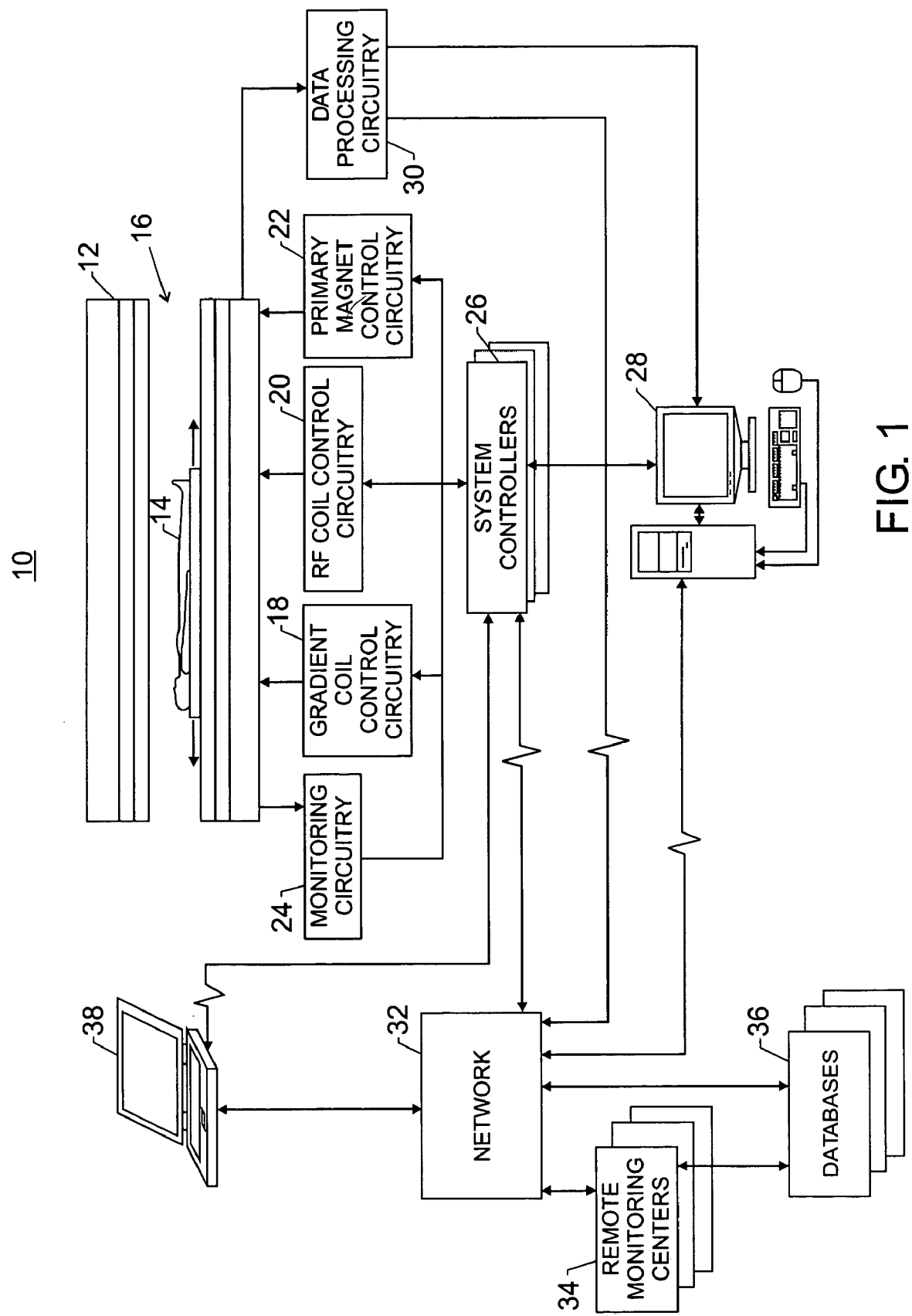
FIG. 1 is a diagrammatical representation of an exemplary imaging network in an operational environment, in accordance with aspects of the present technique.

Turning to the drawings, FIG. 1 illustrates an exemplary imaging network 10. Although described with respect to a medical imaging device, it should be note that the present technique may be applied to any number of systems or devices that employ a cryogen for cooling, such as spectroscopy systems, nuclear accelerators, biological cooling facilities, and power transmission systems, to name but a few. The exemplary imaging network 10 includes a magnetic resonance imaging MRI scanner 12. Aspects of this system will be described first to provide a basis for better understanding of the transport and handling processes offered by the present innovations.

When installed at a medical facility (i.e., during an operational state), a medical professional may direct a patient 14 into a patient bore 16 of the MRI scanner 12 to obtain diagnostic images of the patient 14. A main magnetic field (i.e., 0.5-2.0 Tesla) is generally present in the patient bore 16. This field, as discussed further below, is produced by a superconductive electromagnet (see FIG. 2) disposed circumferentially about the patient bore 16. The superconductive electromagnet is maintained at superconducting temperatures (e.g., 1-5 degrees Kelvin) to reduce the electrical resistance in the magnet coils to substantially zero. Advantageously, the superconductive nature of the electromagnet reduces the electrical requirements for producing the magnetic field, thereby making the MRI scanner 12 more economical to operate. It should be noted that, while in the present description reference is made to a horizontal cylindrical bore imaging system employing a super conducting primary field magnet assembly, as discussed below, the present technique may be applied to various other configurations, such as scanners employing vertical fields generated by super conducting magnets, permanent magnets, electromagnets or combinations of these means. Additionally, to manipulate the main magnetic field and to obtain diagnostic images, the MRI scanner 12 includes gradient magnets or coils, and radio frequency (rf) coils (not shown), both of which may be of generally known construction.

Operation of the MRI scanner 12 may be controlled and/or monitored by any number of control and monitoring circuits. By way of example, the gradient coils, the rf coils, and the main magnet may be controlled by gradient coil control circuitry 18, rf coil control circuitry 20, and main magnet control circuitry 22, respectively. Moreover, as discussed further below, various operations and conditions of the MRI scanner 12 may be monitored by monitoring circuitry 24.

Certain of these control and monitoring circuits may function under the direction of one or more system controllers 26, such as the heater controller and cooling system controller discussed further below. The system controller may include any suitable programmable logic device, such as a CPU or a digital signal processor of a general purpose or application. The system controller also may include memory circuitry, such as volatile and non-volatile memory devices, for storing physical and logical axis configuration parameters, examination pulse sequence descriptions, acquired image data, programming routines, and so forth, used during the examination sequences implemented by the scanner. Advantageously, the system controllers 26 may permit some amount of adaptation or configuration of the examination sequence by means of an operator interface 28. The operator interface 28 may be a computer terminal that provides a graphical user interface (GUI) to an individual for the receipt of information from and the input of commands to the MRI scanner 12.

Additionally, the exemplary MRI scanner 12 is coupled to data processing circuitry 30, which receives the detected imaging signals and processes the signals to obtain data for image reconstruction. In the exemplary MRI scanner 12, the data processing circuitry 30 digitizes the received signals and performs a two-dimensional fast Fourier transform on the signals to decode specific locations in the selected slice from which the received signals originated, thereby producing image data representative of the patient's internal tissue and organs, or more generally, features of interest of a subject. The resulting image data may be forwarded to the operator interface 28 for viewing. The image data may also be sent to a remote data repository for storage, as discussed further below. Advantageously, the data processing circuitry 30 may perform a wide range of other functions, such as image enhancement, dynamic range adjustment, intensity adjustment, smoothing, sharpening, and so forth. However, it should be appreciated that such functions may also be performed by software and/or hardware included in the operator interface 28 as well as at remote locations, which are discussed further below.

In many instances, the MRI scanner 12 may communicate with remote locations and devices via a network 32, such as a Local Area Network (LAN), a Server Area Network (SAN), a Metropolitan Area Network (MAN), a Wide Area Network (WAN), a Virtual Private Network (VPN), the Internet, or any other suitable kind of network. Communications over the network 32 may be conducted via any number of communications schemes and protocols, such as Global Standard for Mobile (GSM), Time Division for Multiple Access (TDMA), Code Division Multiple Access (CDMA), Frequency Division Multiple Access (FDMA), radio frequencies (rf), or any other suitable communications techniques. By way of example, the imaging network 10 may include remote monitoring centers 34, which may receive operation data and imaging data from the MRI scanner 12 via the network 32. Advantageously, the remote monitoring centers 34, via the network 32, may improve the image data quality as well as monitor and adjust the operating parameters remotely.

The network 32 may also facilitate access to remote databases 36. Advantageously, the remote databases 36 may store large volumes of image data and operating data from a wide variety of sources coupled to the network. That is, data from multiple MRI scanners 12 and patients 14 may be stored in a central location. Indeed, image or operating data may be accessed by user interfaces 28 at locations remote from the imaging scanner 12.

In certain instances, a field technician may wish to access data or operating parameters from the MRI scanner 12. Accordingly, a field unit 38, such as a laptop computer or hand-held device, may be linked to the system controllers 26. To improve portability, the field unit 38 may be configured to communicate with the system controllers 26 via a wireless protocol, such as IEEE 802.11(b), Bluetooth, or rf communications. Advantageously, the field technician, via the field unit 38, may be able to monitor operations of the MRI scanner 12 and provide system adjustments in response, to improve the quality of the images produced. Of course, the field unit 38 may also communicate with the imaging scanner 12 via the network 32.

Figure 2:
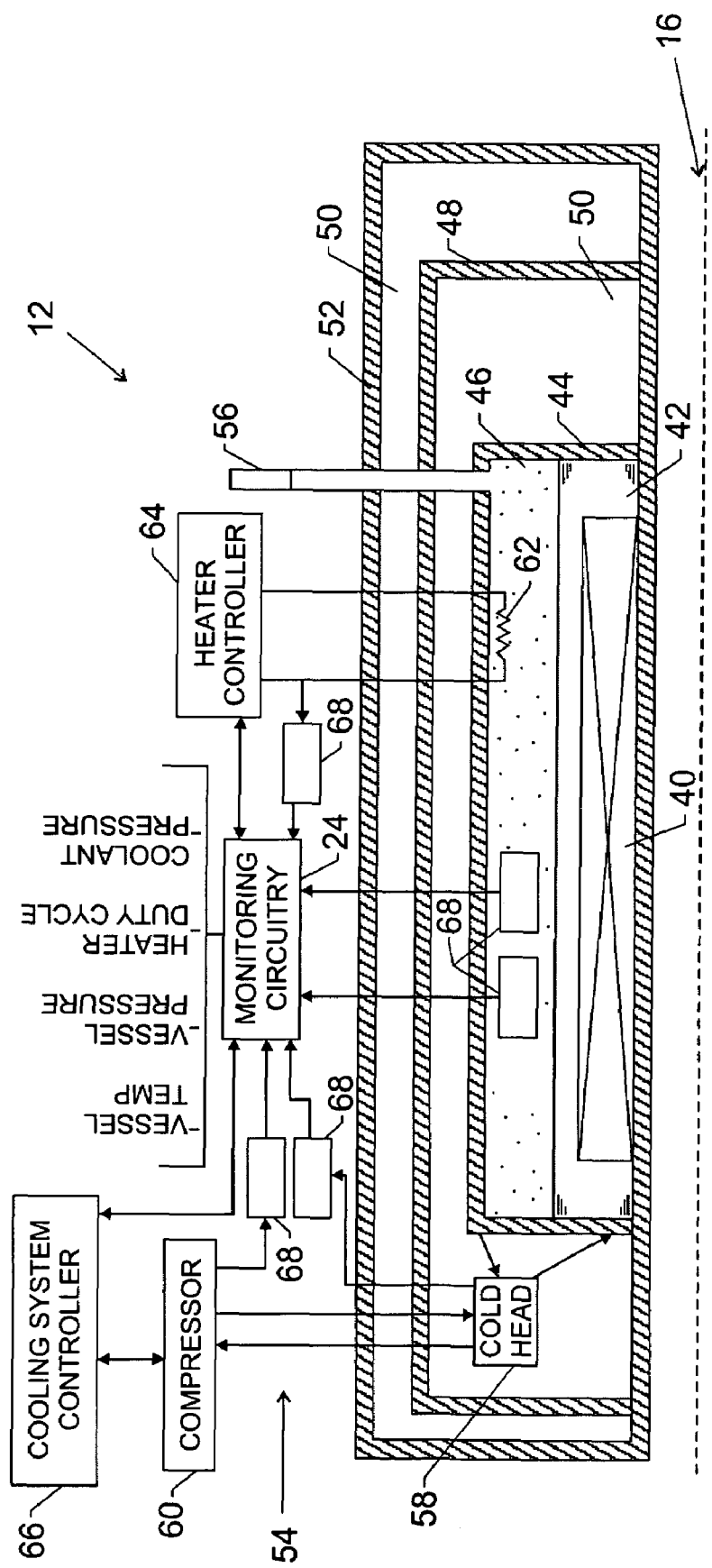
FIG. 2 is a partial cross-sectional view of an exemplary imaging device having features in accordance with the present technique.

Turning to FIG. 2, a partial cross-sectional view of an MRI scanner 12 is presented. Only an upper portion (i.e., above the centerline) of the exemplary, tubular MRI scanner 12 is illustrated. Because of the tubular design, the lower portion is similar to the upper portion, and, as such, the lower portion is not separately discussed. Additionally, it should be noted that, although a tubular scanner structure is described here, other geometries of magnets are known and presently in use, and can benefit from aspects of the present technique. For example, split imaging systems are known, in which an imaging volume is defined between two separated magnet sections. The sections are typically positioned either one above the other, or in a side-by-side arrangement. In either case, however, the superconductive magnet is cooled by a cryogenic system that may be maintained and serviced as described below. As discussed above, the MRI scanner 12 maintains a main magnetic field of approximately 0.5 to 2.0 Tesla in the patient bore 16. To produce the main magnetic field, the exemplary MRI scanner 12 includes a magnet 40 located towards the center of the MRI scanner 12 and disposed circumferentially about the patient bore 16. The main magnet is an electromagnet formed of loops of coiled wire. Routing electrical current through the coiled wire produces a magnetic field. To reduce the electrical load necessary to produce the desired main magnetic field, the exemplary electromagnet may be cooled to a superconductive state.

To transition the electromagnet to a superconductive state, the electromagnet 40 may be bathed in a cryogen, such as liquid helium 42, contained in a helium vessel 44, which circumscribes the patient bore 16 and surrounds the electromagnet 40. The liquid helium cools the electromagnet to superconductive temperatures (e.g., −271C or 4k). At superconductive temperatures, the electromagnet 40 (i.e., the loops of coiled wire) conducts electrical current essentially free of electrical resistance. Of course, the particular temperature at which the magnet materials transition to a superconducting state may vary depending upon the material used, and the specific temperature is not a limitation of the present technique. Advantageously, a relatively strong magnetic field (0.5-2.0 Tesla) may be produced at lesser electrical loads in comparison to traditional magnets, thereby reducing the operating costs of producing and maintaining the magnetic field. Other field strengths are, of course, possible, with spectroscopy and other systems obtaining significantly higher flux densities.

Liquid helium 42, similar to other cryogens, vaporizes into a gaseous state (i.e., gaseous helium 46) at relatively low temperatures (e.g., liquid helium boils at 4.2K under standard pressure conditions). Accordingly, to insulate the helium 42 and 46 from external heat sources, the helium vessel 44 may be surrounded by a radiation heat shield 48. Advantageously, a vacuum region 50 located between the helium vessel 44 and the heat shield 48, as well as between the heat shield 48 and an outer housing 52 of the MRI scanner 12 may further insulate the helium vessel 44 from external heat sources.

Furthermore, as also discussed below, the vaporization of the liquid helium 42 typically increases the pressure in the helium vessel 44. Accordingly, the helium vessel 44 may be coupled to a vent or relief valve 56. In the present embodiment, for example, if pressure in the helium vessel 44 reaches or exceeds a desired operating pressure (e.g., 4 psi), the vent may release excess helium 46 to relieve the pressure. However, because helium is relatively expensive, the venting of the helium is to be avoided. Moreover, an increase in the pressure of the helium vessel 44 may increase the boiling point of the liquid helium 46, thereby increasing the temperature of the helium within the vessel and leading to a loss of superconductivity in the magnet 40.

To conserve helium, the helium vessel 44 may be part of a cryogenic cooling system 54, which recondenses gaseous helium 46 back into its liquid phase 42. In the exemplary MRI scanner 12, the cryogenic cooling system 54 includes a cold head 58 coupled to a compressor 60. As appreciated by those skilled in the art, the compressor 60 pressurizes a coolant, such as liquid nitrogen, and circulates the coolant to the cold head 58. By allowing the coolant to decrease in pressure, fins (not shown) in the cold head 58 may be cooled to the condensation point of the cryogen, that is, a low enough to cause the gaseous helium 46, for example, to return to its liquid phase. In a cyclical manner, the gaseous helium 46 is routed from the vessel, in the cold head 58, and across the fins. The fins, which are to cooled to approximately 2-4K, condense the helium into its liquid phase, and the recondensed liquid helium 42 is routed back into the helium vessel 44, thereby conserving the helium in the vessel 44 and producing an equilibrium between the liquid and gaseous phases of the helium. Indeed, the cryogenic cooling system 54 may maintain the pressure within the vessel, thereby causing the liquid helium to boil at the desired temperature.

During operation of the MRI scanner 12, it may be advantageous to maintain the pressure within the helium vessel 44 within predetermined parameters, e.g., 4.0 to 4.3 psi. However, if, for example, the equilibrium in the helium vessel 44 is biased towards the liquid phase of the helium by the cold head 58, the helium vessel 44 may reach a negative pressure condition allowing atmospheric gases to be drawn into the vessel 44. If atmospheric gases enter the helium vessel 44, water vapor in the atmosphere may freeze, causing clogs in the cooling system that degrade the performance and, in certain instances, leading to the failure of the cryogenic cooling system 54 and/or the MRI scanner 12. Thus, to increase the pressure (i.e., increase the pressure to a positive pressure condition), a heating element 62, such as a resistive heating element, is located in the helium vessel 44. As discussed further below, while the cold head 58 operates substantially continuously, power to the heating element 62 cycles to maintain an equilibrium within the vessel 44. The operating periods of the heating element 62 may be referred to as the heater duty cycle. In a present embodiment, power to the heating element 62 is controlled in a closed-loop manner based upon pressure detected within the vessel, to maintain the pressure between desired minimum and maximum levels.

Alternatively, if, for example, the equilibrium is biased towards the gaseous phase by the cold head 58 operating inefficiently or by external heat sources, the pressure in the vessel 44 may increase, leading to an undesired venting of helium and/or degradation in image quality. As discussed further below, if a high-pressure condition is detected, a cooling system controller 66 may optimize and adjust operations of the cooling system 54 to bias the equilibrium of the helium towards the liquid phase, thereby reducing the pressure in the vessel 44.

To monitor operation of the MRI scanner 12, a plurality of sensors 68 may be located throughout the MRI scanner 12, and particularly on or in the main magnet structures and support systems. For example, temperature and pressure sensors, collectively indicated generally by reference numeral 68, located in the vessel 44 may monitor conditions in the helium vessel 44. Additionally, other sensors 68 may monitor the cryogenic cooling system 54 (e.g., the cold head 58 and the compressor 60). Similarly, yet other sensors 68 may monitor the heat producing components (e.g., the heating element 62) of the cryogenic cooling system 56. Of course, there may be any number of sensors 68 located throughout the MRI scanner 12 for monitoring any number of conditions. Indeed, the sensors may monitor not only the cryogenic cooling system, but rather other components and systems as well.

The various sensors 68 throughout the system may provide operational data regarding the MRI scanner 12 to the monitoring circuitry 24. Moreover, the heater controller and the cooling system controller may also provide data to the monitoring circuitry 24. By way of example, the monitoring circuitry 24 may receive and process data regarding the temperature within the vessel, the pressure within the vessel, the heater duty cycle, coolant pressure within the cooling system, or a host of any other operating conditions regarding the MRI scanner. Advantageously, the monitoring circuitry 24 may be configured to communicate the processed and received information to the network 32 as well as to the user interface 28 (see FIG. 1).

Figure 3:
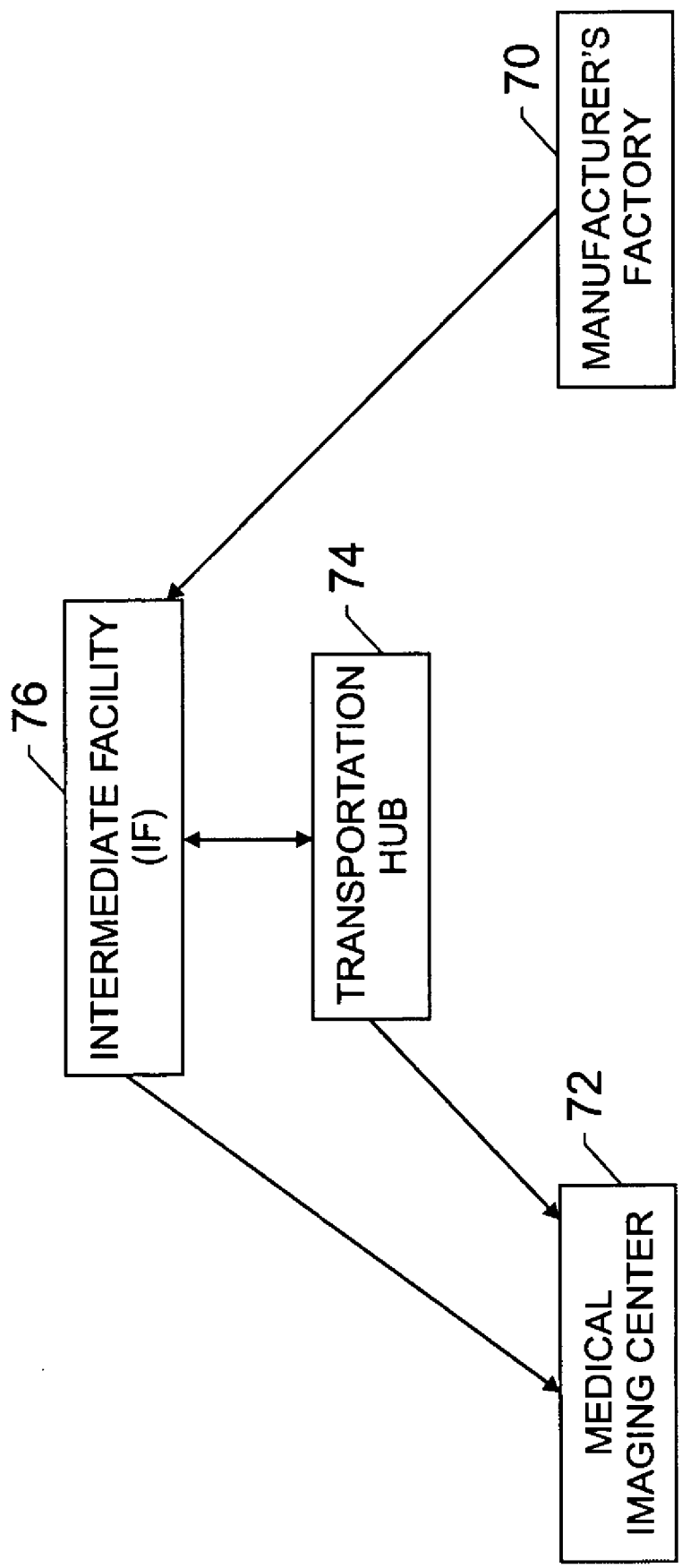
FIG. 3 is a diagrammatical representation of exemplary routes for transportation of the imaging device of FIG. 2, in accordance with aspects of the present technique.

Prior to operation, the MRI scanner 12 (see FIG. 2) may be manufactured at a manufacturer's factory 70 and routed to a medical imaging center 72 for use, as illustrated in FIG. 3. By of example, a transportation provider, such as a freight carrier, a trucking company, or an airline, may contract with the manufacturer to deliver the MRI scanner 12 to the medical imaging center 72, such as a hospital, a clinic, or an imaging laboratory. It should be noted that the transportation provider may consist of one or more transportation providers. That is, various phases of the transportation process, as discussed further below, may be provided by a single transportation provider or a consortium or series of transportation providers.

Prior to shipment of the MRI scanner 12 (see FIG. 2) to the medical imaging center 72, the manufacturer may bring the MRI scanner 12 to an operational state (i.e., online) at the factory 70 to test the various components of the MRI scanner 12, which are discussed above. Advantageously, onsite technicians at the factory 70 may diagnose and correct issues with respect to the MRI scanner 12 quickly. Additionally, it may be advantageous to bring the MRI scanner 12 to a superconductive state at the factory 70 rather than at the medical imaging center 72. For example, the cost of supplying an initial load of liquid helium to the MRI scanner 12 from a bulk supply at the factory 70 may be less than the costs of supplying this initial load at a field location, such as the medical imaging center 72. This is generally done, in any event, to verify and confirm the proper operation of the magnet system prior to shipment. Moreover, it may be cost effective to maintain this superconductive state once it has been achieved. That is, the costs of maintaining the superconductive state may be less than the costs of initiating the superconductive state.

Once the imaging device has been properly brought online and tested, the manufacturer may prepare the MRI scanner 12 (FIG. 2) for transportation to the medical imaging center 72. This preparation, however, may disconnect the MRI scanner from various resources available at the factory 70. For example, various monitoring devices of both the factory and the MRI scanner 12 may be disconnected. Moreover, the MRI scanner 12 may be disconnected from its power supply, thereby deactivating the cryogenic cooling system 54 (see FIG. 2). As discussed above, deactivation of the cryogenic cooling system 54 leads to a shift in the equilibrium of the helium towards the gaseous phase. In turn, this may lead to a loss of helium and/or superconductivity in the MRI scanner 12, as discussed above. Indeed, such events are to be avoided.

The MRI scanner 12, however, may not realize these effects instantaneously upon disconnection from the factory's 70 resources. For example, the insulative features of the MRI scanner 12, e.g., radiation shield 48 and vacuum regions 50 (see FIG. 2), may maintain the helium within desired operating parameters, as discussed above. That is, the MRI scanner 12 may not lose a substantial amount of cryogen and/or superconductivity for short time interval from disconnection of the factory's 70 resources—a few weeks, for example.

Although the distance between the factory 70 and the medical imaging center 72 may facilitate delivery of the MRI scanner 12 within this limited time interval, the transportation provider may not directly ship the MRI scanner 12

(see FIG. 2) from the factory to the imaging center 72. For example, the route of travel taken by the transportation provider may include a transportation hub 74, such as an airport, a major city, a depot, or a warehouse of the transportation provider. Indeed, prior to reaching the medical imaging center 72, the MRI scanner 12 may travel through a number of transportation hubs 74. Such indirect shipment may extend the transportation time of the MRI scanner 12 and, in certain instances, may fall outside the desired time-interval for transporting the MRI scanner 12.

Additionally, once shipped to the transportation hub 74, the transportation provider may not have the resources to immediately transport the MRI scanner 12 to the medical imaging center 72. For example, the proper transportation vehicle may not be available. Accordingly, the MRI scanner 12 may remain at the transportation hub 74 until the proper transportation vehicle is obtained, thereby extending the transportation time. Furthermore, even if the MRI scanner 12 is shipped directly from the factory 70 to the medical imaging center 72, the distance between these two facilities may prevent shipment of the MRI scanner within the desired time-interval time.

Indeed, each of foregoing exemplary circumstances may extend the transportation time of the MRI scanner 12 and may cause the transportation time to fall outside the desired time-interval. That is, the insulative features of the MRI scanner 12 may not sufficiently protect against the loss of the cryogen and the superconductivity of the MRI scanner 12 for the duration of the extend transport, i.e., the extended transportation times. As discussed above, the loss of cryogen and/or the superconductivity of the MRI scanner 12 are events to be avoided.

In certain instances, the medical imaging center 72 may not be prepared to receive the MRI scanner 12 (see FIG. 2). For example, the medical imaging center may be under construction and, as such, may lack a power supply for the MRI scanner 12. However, the factory 70 may not be able to hold the completed MRI scanner 12 until the medical imaging center 72 is ready. For example, the factory 70 may not have sufficient space for storage. Moreover, certain economic events, such as accounting obligations, may accrue if the MRI scanner 12 has not shipped from the factory 70. Accordingly, a manufacturer may ship the MRI scanner 12 prematurely to the transportation hub 74 or the uncompleted medical imaging center 72. By way of example, this premature shipment may increase the offline time of the cryogenic cooling system 54, leading to loss of cryogen and/or superconductivity, events that are to be avoided.

As one example, to reduce the negative effects of the extended transportation times, the MRI scanner 12 (see FIG. 1) may be routed from the factory 70 to an intermediate facility 76 (IF). For example, the transportation provider may receive the MRI scanner 12 from the factory and ship it to the IF 76. Of course, the IF 76 may receive MRI scanners 12 from a number of factories 70 as well as from a number of transportation hubs 74. The IF 76 may be a structure, such as a warehouse, configured for storage of the MRI scanner 12. As discussed further below, the IF 76 may provide resources to the MRI scanner 12 to reduce the negative effects of extended transportation times discussed above. Once at the IF 76, the MRI scanner 12 may be coupled to resources (e.g., a supply power) of the IF 76 to maintain the helium in the MRI scanner 12, for example. Accordingly, the adverse effects of the length of transportation time, as discussed above, may be reduced. Additionally, to efficiently provide the various resources, the IF 76 may be under the direction of a computer program.

Once the medical imaging center 72 or the transportation provider is prepared to receive the MRI scanner 12, it may be transported to the medical imaging center 72 via one of the routes discussed above. Advantageously, the IF 76 may be located on the appropriate route between the factory 70 and medical imaging center 72 at a point proximate to the transportation hub 74. For example, the physical distance between the hub 74 and the IF 76 may be relatively small, a few miles for example. Alternatively, the IF 76 may be located proximate to the medical imaging center 72. Because of such proximity, delays or extensions in transportation time of the MRI scanner 12 between these facilities may be reduced. Moreover, the route between the factory 70 and the medical imaging center 72 may include a number of IFs 76. Advantageously, the IFs 76 may be located near airports of major cities, such as Chicago, New York, Houston, and Memphis, to name but a few major cities. Of course, it should be understood the IFs 76 may be located at any number of strategic locations, and need not be tied to the location of the transportation hubs 74.

Figure 4:
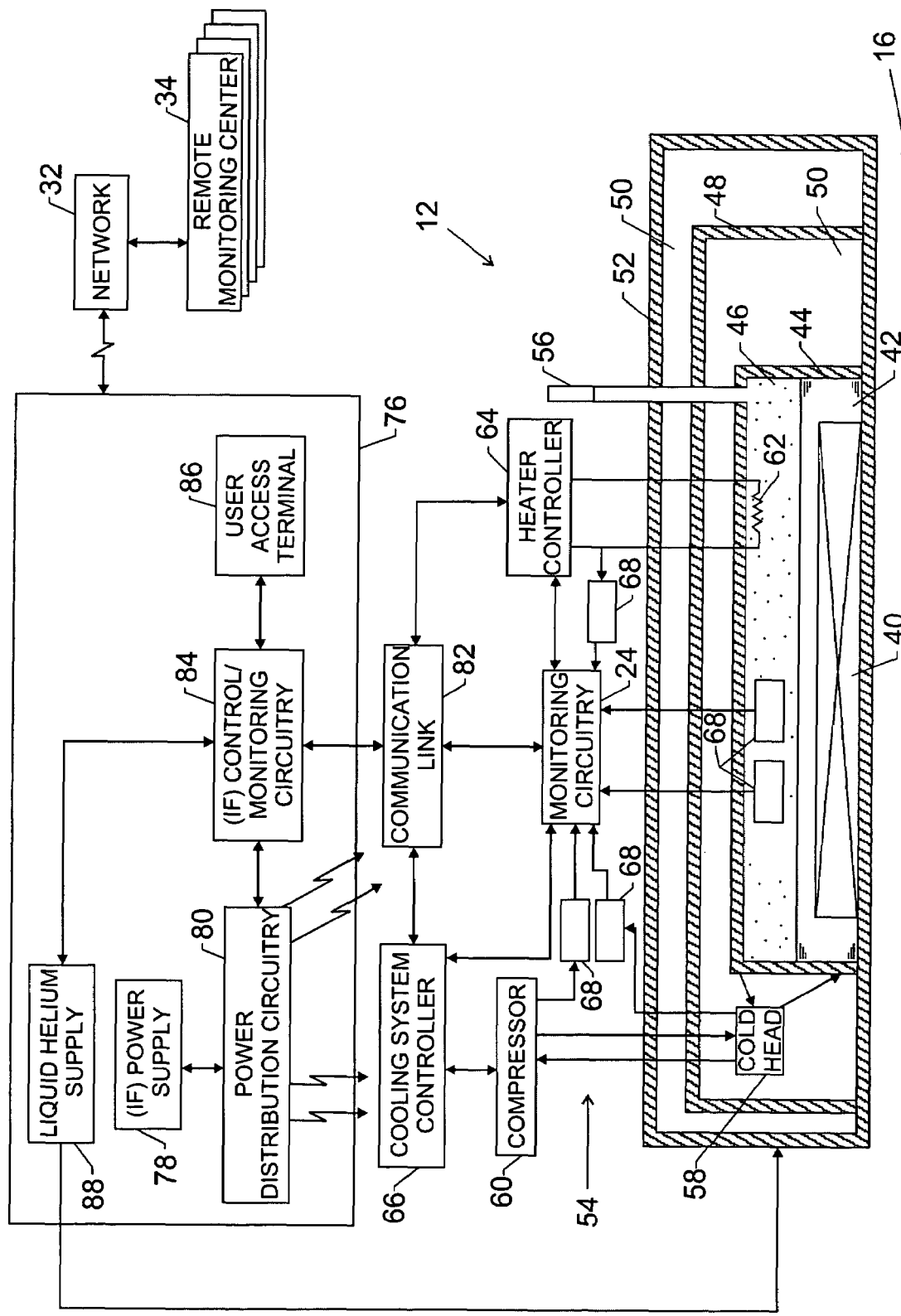
FIG. 4 is a diagrammatical representation of the imaging device of FIG. 2 at a point in transit along the exemplary routes of FIG. 3, in accordance with aspects of the present technique.

Turning to FIG. 4, an exemplary IF 76 is illustrated. The exemplary IF 76 includes a number of resources for maintaining the MRI scanner 12. For example, the IF 76 may have a power supply 78 for powering the components of the IF 76 as well as the MRI scanner 12. The power supply 78 may be generated remotely by a power generating and distribution company or locally via a generator, for example. Additionally, the IF 76 may include power distribution circuitry 80, which may appropriately condition and distribute power to the various components of the MRI scanner 12 (e.g., the cryogen cooling system 54, the monitoring circuitry 24, and sensors 68) and of the IF 76. Advantageously, the power supply 78 and the distribution circuitry 80 may provide sufficient power to operate the cryogenic cooling system 54 in the MRI scanner 12. For example, the liquid helium in the MRI scanner 12 may be actively maintained within desired parameters by substantially continuous powered operation of the cryogenic cooling system 54. That is to say, actively maintaining is to affirmatively affect the helium. With power, as present by way of example, the cryogenic cooling system 54 may operate in accordance with the recondensing process as discussed above. Advantageously, by actively maintaining the MRI scanner 12, the transportation time may be extended without increasing the likelihood of adverse effects of transportation occurring. For example, the IF 76 may maintain the superconductivity and/or cryogen of the MRI scanner 12 for months, if not longer.

Additionally, the IF 76 may include a communication link 82, which may be a traditional cable connection or a wireless connection via a wireless protocol, such as RF, IEEE 802.11 (b), or Bluetooth, to name but a few types. The communication link 82 may couple the MRI scanner 12 to IF control and monitoring circuitry 84, thereby facilitating the receipt and transmission of data and commands between the MRI scanner 12 and the IF 76. For example, the MRI scanner 12 may transmit data regarding its condition to the IF control and monitoring circuitry 84 via the communication link 82. Advantageously, the IF control and monitoring circuitry 84 may analyze this data and provide appropriate commands to the MRI scanner 12 in response. Additionally, a user may provide commands to and receive data from the MRI scanner 12 at a user interface terminal 86 coupled to the IF control and monitoring circuitry 84. In either event, the IF control and monitoring circuitry 89 may be under the direction of a computer program. Furthermore, the IF 76 and its various components and systems may communicate with the remote monitoring centers 34 via the network 32, as discussed above. Accordingly, the remote monitoring centers 34 may monitor conditions of the MRI scanner 12 at the IF 76 in real-time and may provide appropriate commands in response.

The IF 76 also may include a liquid helium supply system 88. For example, the IF 76 may maintain a bulk quantity of liquid helium within a vessel for replacing helium lost from the MRI scanner 12. For example, if a low helium level is detected in the MRI scanner 12, the helium supply system 88 may provide a replenishing supply of liquid helium to the vessel 44. The supply system helium may be maintained by a IF cryogenic cooling system similar to the MRI scanner's 12 cryogen cooling system 54 discussed above. Advantageously, the IF control and monitoring circuitry 84 may provide commands to and receive information from the liquid helium supply system 88 to which it is connected.

Figure 5:
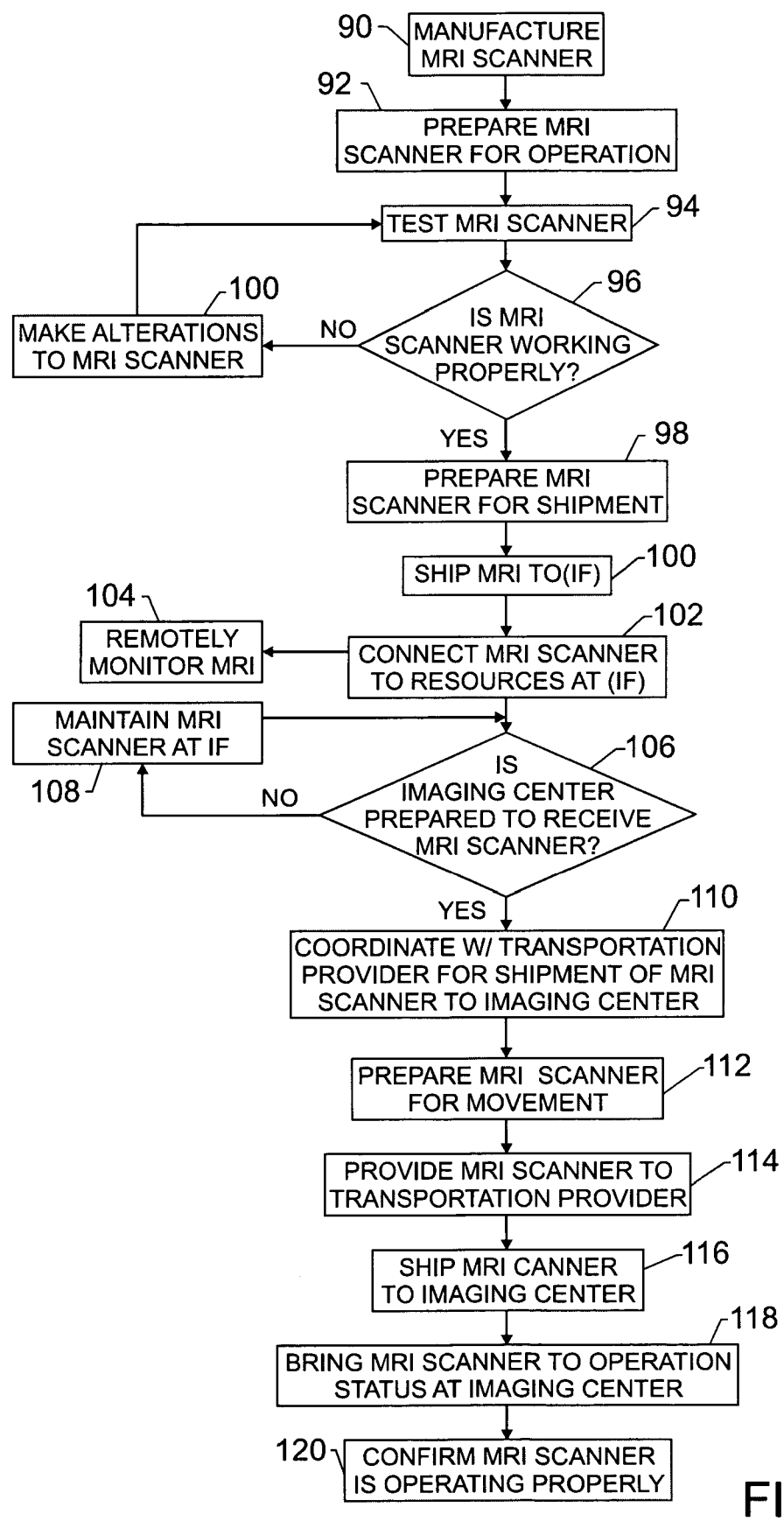
FIG. 5 is a flow chart representing steps in an exemplary process for manufacture and delivery of the imaging device of FIG. 2 along the routes of FIG. 3, in accordance with aspects of the present technique.

Keeping FIGS. 1-4 in mind, FIG. 5 illustrates an exemplary process for preparing and transporting an MRI scanner 12. In the exemplary process, the manufacture may fabricate the MRI scanner 12 at the factory 70, as represented by block 90. At the factory 70, the manufacture also may prepare the MRI scanner 12 for preliminary operations, as represented in the exemplary process as block 92. By way of example, the manufacturer may supply an initial load of liquid helium to the MRI scanner 12 (i.e., in the helium vessel 44) and activate the cryogen cooling system 54. Moreover, the manufacturer may bring the magnet 40 to a superconductive state by sufficiently cooling it. Because of the superconductivity of the magnet 40, a charge placed in the magnet 40 essentially does not dissipate due to electrical resistance. Once operational, the manufacture may test the MRI scanner 12 at the factory 70, as represented by block 94 in the exemplary process. For example, the manufacturer may test the image quality of the MRI scanner 12 as well as the operations of its various systems. If the manufacturer determines that the MRI scanner 12 is operating properly, as represented by block 96, the manufacturer may prepare the MRI scanner 12 for shipment, which is represented in exemplary process as block 98. However, if the manufacturer finds that the MRI scanner 12 is not operating properly, the manufacturer may make adjustments and alterations to the MRI scanner 12, as represented by block 99. Once adjusted, the manufacturer may retest the MRI scanner 12 and repeat the process until the manufacturer's quality control protocols are satisfied.

In preparing the MRI scanner 12 for shipment, the MRI scanner 12 may be disconnected from the operational resources available at the factory 70. For example, the MRI scanner 12 may be uncoupled from its factory power supply, thereby taking the cryogen cooling system 54 offline. To reduce the negative effects of prolonged separation of the MRI scanner 12 from operational resources (e.g., power), the transportation provider may ship the MRI scanner 12 to the IF 76, as represented by block 100. Once received at the IF 76, the MRI scanner 12 may be coupled to the resources of the IF 76, as discussed above. Block 102 represents this step of the exemplary process. Because the IF 76 may communicate via the network 32, remote monitoring centers 34 may monitor conditions of the MRI scanner 12 during this phase of the MRI scanner's transportation, as represented by block 104. Advantageously, the coupling of the MRI scanner 12 to the resources of the IF 76 may extend the transportation time for delivery of the MRI scanner 12 to the medical imaging facility 72 without increasing the negative effects typically associate with such extended times. As stated above, the IF 76 may effectively maintain the MRI scanner 12 for months, if not longer.

As discussed above, the medical imaging center 72 may indicate that it is not prepared to receive the MRI scanner 12, as represented by block 106 in the exemplary process. Accordingly, the IF 76 may maintain the MRI scanner 12 until the medical imaging center 72 is prepared to receive the MRI scanner 12. Block 108 represents this step in the exemplary process. However, once the medical imaging center 72 indicates that it is prepared to receive the MRI scanner 12, it may be advantageous to coordinate with the transportation provider to shorten the transportation time, as represented by block 110. For example, if the transportation provider does not have sufficient resources to transport the MRI scanner 12, the IF 76 may maintain the scanner until the transportation provider is ready. Accordingly, offline times at the transportation hub 74 may be reduced. That is, the duration of time the MRI scanner is disconnected from operational resources may be reduced.

When appropriate, the MRI scanner 12 may be prepared for shipment by the transportation provider, as represented by block 112 in the exemplary process. For example, the MRI scanner 12 may be disconnected from the resources of the IF 76. The transportation provider may then receive the MRI scanner and ship it to the medical imaging center 72, as represented by blocks 114 and 116 respectively. Once received by the medical imaging center 72, the MRI scanner 12 may be coupled to the imaging center's resources and brought to an operational state, as represented by block 118. Advantageously, the MRI scanner 12 may be tested at the medical imaging center 72 to ensure proper operations of the MRI scanner 12, as represented by block 120.

A number of advantages may be achieved by employing aspects of the foregoing exemplary process. For example, by limiting the offline time of the cryogen cooling system 54 via the resources of the IF 76, it may not be necessary to reinitialize the MRI scanner 12 of both the factory 70 and the medical imaging center 72, thereby leading to cost savings. Moreover, the MRI scanner 12 may be operational and ready for use (i.e., examination of patients) soon after delivery at the medical imaging center 72. Furthermore, transportation times may be extended, allowing for flexibility in transporting the MRI scanners.

Figure 6:
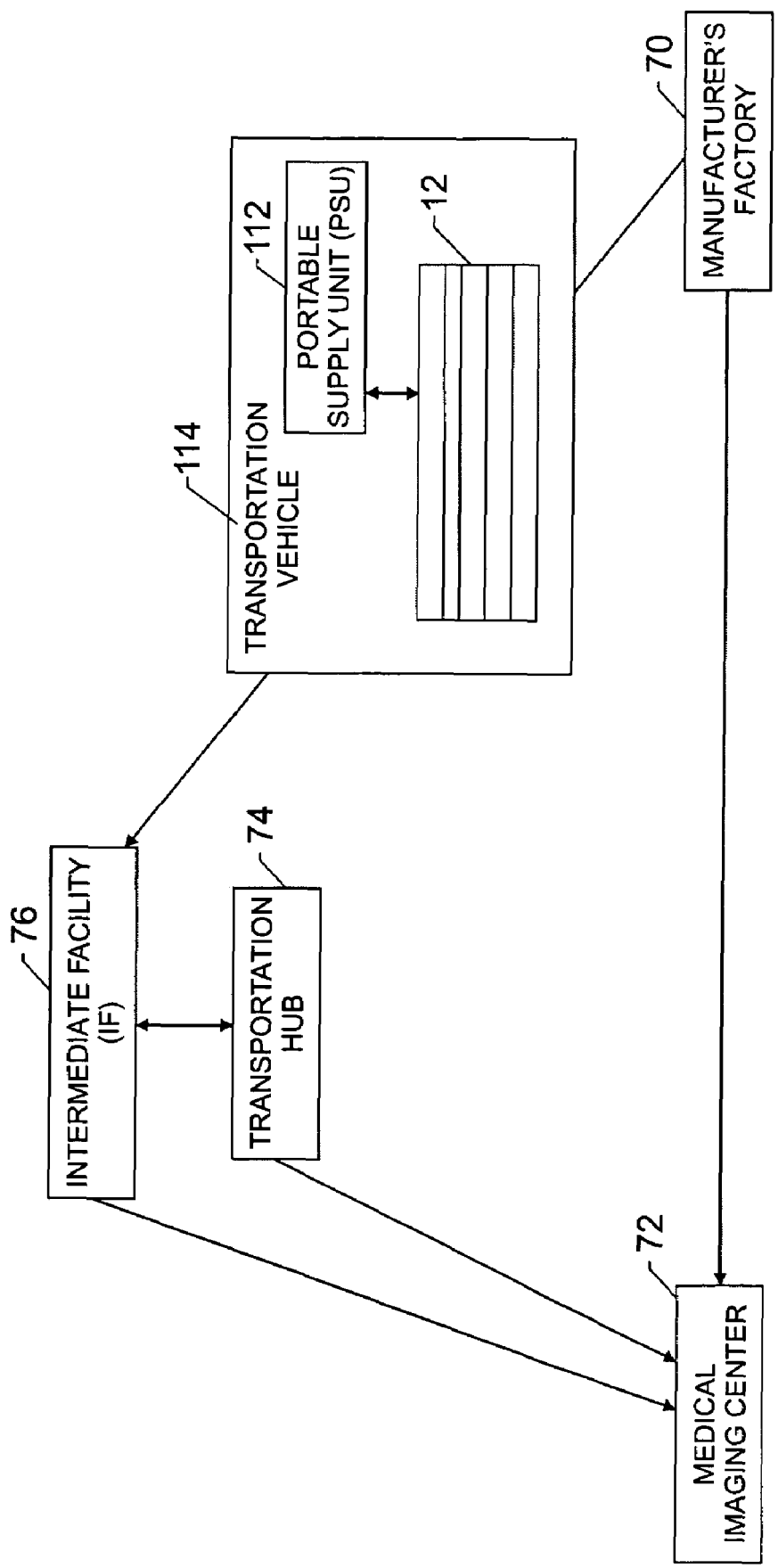
FIG. 6 is a diagrammatical representation of an alternate exemplary routes for the transportation of the imaging device of FIG. 2, in accordance with aspects of the present technique.

As another example, the negative effects of prolonged transportation times may be reduced by the use of a portable supply unit 122 (see FIGS. 6 and 7), details of which are discussed further below. FIG. 6 illustrates an exemplary route for transportation of the MRI scanner 12 from the factory 70 to the medical imaging center 72. As the MRI scanner 12 is transported along this route via a transportation vehicle 114, such as a truck, a train, or an airplane, the MRI scanner 12 may be coupled to the portable supply unit 112 (PSU). As discussed further below, the PSU 112 may provide operational resources to the MRI scanner 12 during transportation.

Figure 7:
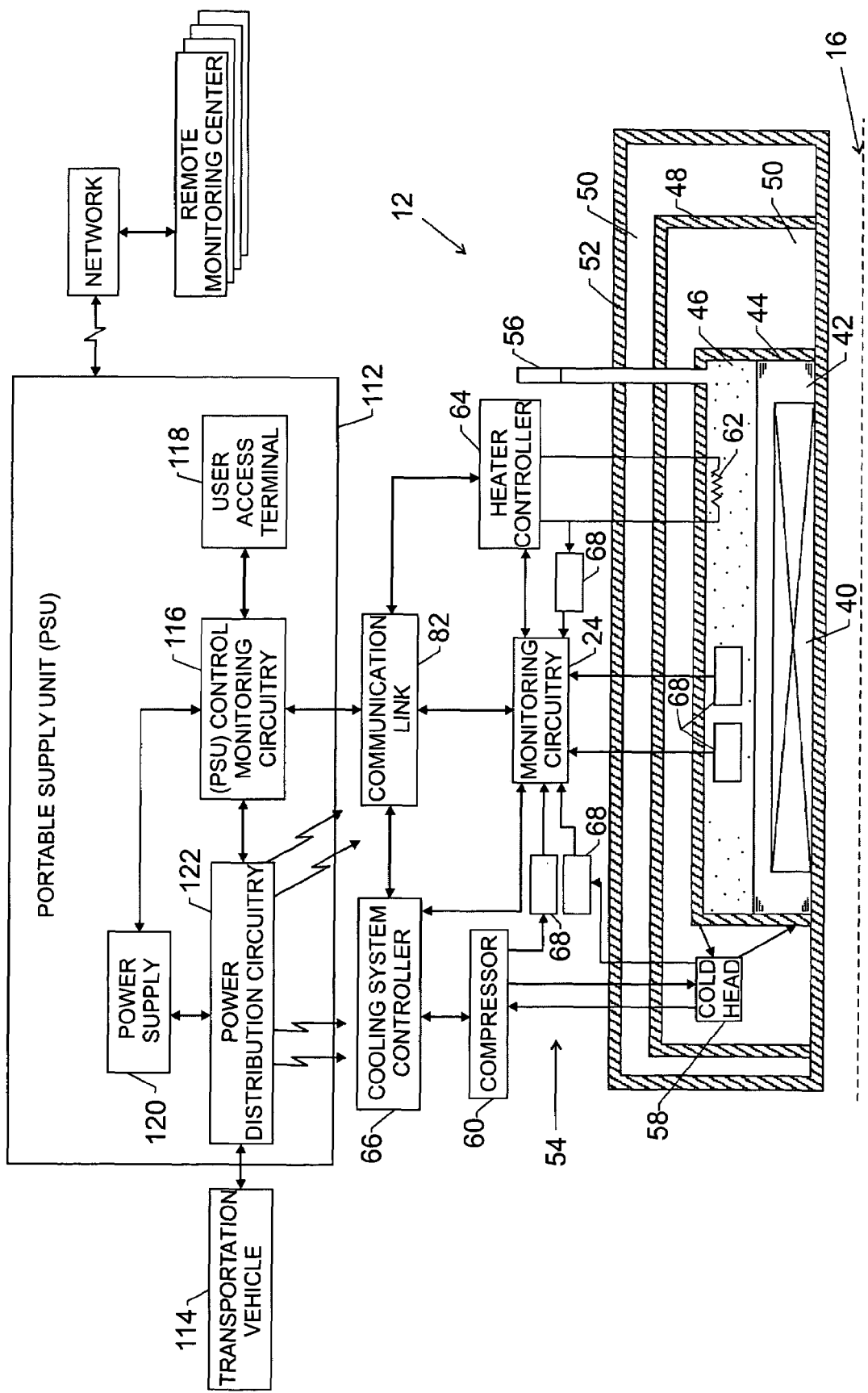
FIG. 7 is a diagrammatical representation of the imaging device of FIG. 2 at a point in transit along the exemplary routes of FIG. 6, in accordance with aspects of the present technique.

FIG. 7 illustrates various components of the exemplary PSU 112 in diagrammatical form. To ease transportation, the PSU 112 may be a relatively compact and self-contained unit that is shipped in the same container as the MRI scanner 12. Advantageously, such lightweight and compact construction may reduce costs for transporting the MRI scanner 12 and the PSU 112.

The PSU 112 may include a number of resources that are similar in composition and function to the resources of the IF 76 discussed above. For example, the PSU 112 may include PSU control and monitoring circuitry 116 that communicates with the MRI scanner 12 via a communication link 82. Advantageously, the PSU control and monitoring circuitry 116 may receive and process information regarding the MRI scanner 12 and may provide appropriate commands in response. Moreover, the PSU 112 may include a user access terminal 118, which may be coupled to the PSU monitoring and control circuitry 116 for the display of data to and the receipt of commands from a user. Moreover, the PSU 112 may be in communication with the remote monitoring centers 34 via the network 32, as discussed above.

Additionally, the PSU 112 may include a power supply 120 for providing power to the PSU 112 as well as to components of the MRI scanner 12. By way of example, the power supply 120 may be a self-contained unit, such as a gas or diesel generator, a fuel cell, or a bank of batteries. As an alternative, the electrical system of the transportation vehicle may provide power to the PSU 112 and MRI scanner 12. The PSU 112 may also include power distribution circuitry 122 that receives power from the various power supplies 120 and appropriately distributes the received power to the various components of the MRI scanner 12 and the PSU 112. Advantageously, the power distribution circuitry 112 may appropriately condition power prior to distribution of power to various components of the PSU 112 and the MRI scanner 12.

Similar to the IF 76, the PSU 112 may provide a number of resources to the MRI scanner 12. Advantageously, the portability of the PSU may facilitate the providing of resources to the MRI scanner 12 during most, if not all, of the MRI scanner's 12 journey between the factory 70 and the medical imaging center 72. For example, the PSU 112 may provide power to the MRI scanner 12 for operation of its cryogen cooling system 54. Accordingly, the cryogen cooling system 54 may maintain the liquid helium 42 within desired parameters. By way of example, the PSU 112 may reduce the likelihood of cryogen loss and/or a loss of superconductivity with respect to the MRI scanner 12. Additionally, the PSU 112 may facilitate remote monitoring of the MRI scanner 12 during transportation from the factory 70 to the medical imaging center 72.

Figure 8:
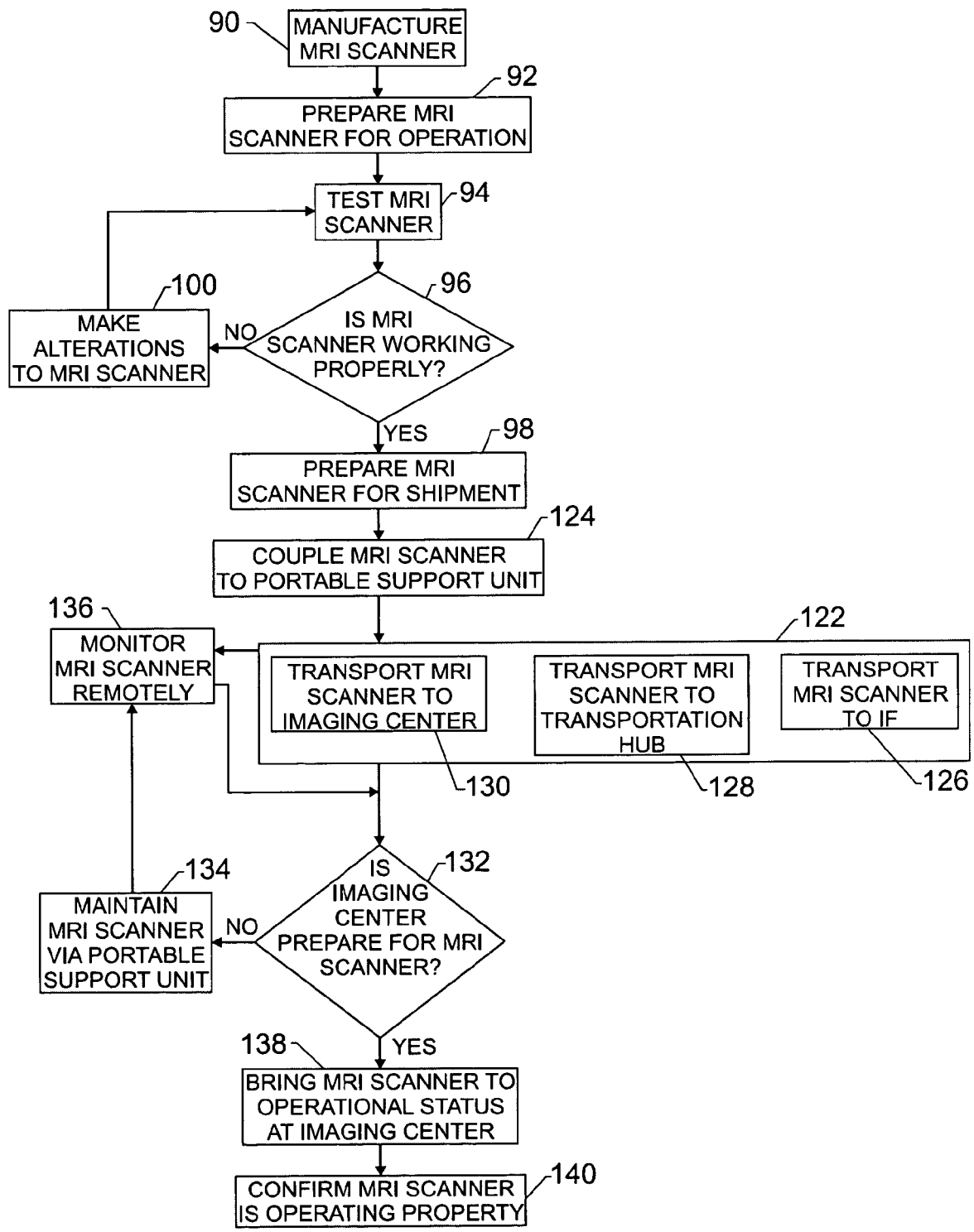
FIG. 8 is a flow chart representing steps in an exemplary process for the manufacture and delivery of the imaging device of FIG. 2 along the routes of FIG. 6, in accordance with aspects of the present technique.

Keeping FIGS. 6 and 7 in mind, FIG. 8 illustrates steps in an exemplary process for preparing an MRI scanner 12 and transporting the MRI scanner with a PSU 112. In the exemplary process, the steps represented by numbered blocks 90-100 are similar to the identically numbered steps discussed in relation to FIG. 5. Accordingly, a discussion regarding these steps (i.e., steps 90-100) is not repeated with respect to the instant figure and process. Once the MRI scanner 12 has been prepared for shipment, as represented by block 98, a PSU 112 may be coupled to the MRI scanner 12, as represented by block 124. As discussed above, the PSU 112 may provide a number of resources to the MRI scanner 12.

Once coupled to the PSU, the MRI scanner 12 may be shipped to any number of locations, as represented by block 126. For example, the MRI scanner 12 may be shipped to the transportation hub 74. Because the exemplary PSU 112 is a self-contained unit, it may provide resources to the MRI scanner 12 during the transportation to the hub 74 as well as during the MRI scanner's 12 residence at the hub 74. Alternatively, the MRI scanner 12 may be shipped to the IF 76. Once received at the IF 76, the PSU 112 may be disengaged from the MRI scanner 12, and the MRI scanner 12 may be coupled to the resources of the IF 76. However, the MRI scanner 12 may remain coupled to the PSU 112 if so desired, as represented by block 134. If the medical imaging center 72 is not prepared to receive the MRI scanner 12, as represented by block 132, the MRI scanner 12 may remain at the transportation hub 74 or the IF 76 indefinitely, as the MRI scanner 12 is maintained by the PSU 112 or the IF 76. Advantageously, the PSU 112 may facilitate remote monitoring of the MRI scanner 12 as it is in transit or at a temporary location, as represented by block 136.

As yet another example, the MRI scanner 12 may be shipped to the medical imaging center 72 as represented by block 130. Advantageously, the PSU 112, as discussed above, may provide resources to the MRI scanner 12 as it is shipped. However, as also discussed above, the medical imaging center 72 may not be prepared to receive the MRI scanner 12, as represented by block 132. Accordingly, the PSU 112 may maintain the MRI scanner 12 at the transportation hub 74 or the IF 76 until the medical imaging center 76 is prepared to receive the MRI scanner 12. However, because of the portability of the PSU 112, the MRI scanner 12 may be delivered to the medical imaging center 72 even if the medical imaging center 72 lacks the proper resources. For example, the PSU 112 may provide power to operate the cryogen cooling system 54, and, as such, the MRI scanner 12 may be stored at the medical imaging center 72 in spite of the fact that power is not available at the imaging center 72.

In either event, once the resources of the medical imaging center 72 are brought online, the MRI scanner 12 may be disconnected from the PSU 112 and coupled to the resources of the imaging center 72. Once connected to the imaging center 72, the MRI scanner 12 may be brought online and tested, as represented by blocks 138 and 140 respectively. Advantageously, by maintaining the MRI scanner 12 during transport, the need to reinitialize the MRI scanner 12 may be mitigated. Moreover, the lead-time between receipt of the MRI scanner 12 and operability of the MRI scanner 12 with respect to patients may be reduced.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims. Indeed, the present technique may be applied not only to cryogenic imaging devices, but rather to a host of devices which employ cryogenic cooling systems.

What is claimed is:

1. A method of transporting a device having a cryogen from a first facility to a second facility, comprising providing commands remotely for actively maintaining the cryogen in the device within pre-determined parameters during at least a portion of a route of travel of the device from the first facility to the second facility, wherein the device comprises a cryogenically cooled magnet, an imaging device, a medical diagnostic device, a cryogenically cooled superconductive device, or a combination thereof.

2. The method as recited in claim 1, comprising monitoring conditions of the cryogen during at least a portion of the travel of the device from the first facility to the second facility.

3. The method as recited in claim 2, wherein monitoring comprises monitoring remotely.

4. The method as recited in claim 1, wherein actively maintaining comprises supplying the device with resources for cooling the cryogen via the resources of a third facility located at an intermediate point along the route of travel.

5. The method as recited in claim 1, wherein actively maintaining comprises supplying the device with resources for cooling the cryogen via a portable supply unit.

6. The method as recited in claim 1, comprising providing the device to the second facility such that the device is in a superconductive state.

7. The method as recited in claim 1, comprising providing power to a cryogen cooling system of the device to recondense the cryogen.

8. The method as recited in claim 1, comprising providing replacement cryogen to the device.

9. The method as recited in claim 1, wherein the device is the imaging device.

10. The method as recited in claim 1, comprising maintaining the device in a superconductive state.

11. The method as recited in claim 1, comprising actively maintaining the cryogen in the device within pre-determined parameters upon delivery of the device to the second facility and prior to coupling of the device to resources of the second facility.

12. An apparatus for use with a device having cryogen and a cryogenic cooling system, comprising:
a portable resource supply configured to provide resources to the cryogenic cooling system of the device such that the cryogen cooling system maintains the cryogen within pre-determined parameters during transportation of the device from a first facility to a second facility, wherein the apparatus is configured to receive commands for controlling the cryogen cooling system, wherein the device comprises a cryogenically cooled magnet, an imaging device, a medical diagnostic device, a cryogenically cooled superconductive device, or a combination thereof.

13. The apparatus as recited in claim 12, wherein the apparatus comprises monitoring circuitry configured to monitor conditions of at least one of the cryogen and the cryogen cooling system during transportation of the device.

14. The apparatus as recited in claim 13, wherein the apparatus is configured to transmit information regarding the monitored conditions to a remote location.

15. The system apparatus as recited in claim 14, wherein the apparatus is configured to transmit the information regarding the monitored conditions via a network.

16. The system apparatus as recited in claim 12, wherein the device comprises and imaging device.

17. A method of maintaining a cryogenic imaging device during transport from a first facility to a second facility, comprising:
receiving the cryogenic imaging device from the first facility at a third facility via a first transportation provider, wherein the third facility is located at an intermediate point on a transportation route between the first and second facilities;
actively maintaining cryogen within the cryogenic imaging device within pre-determined parameters via resources of the third facility; and
providing the cryogenic imaging device to a second transportation provider for transportation to the second facility.

18. The method as recited in claim 17, wherein actively maintaining comprises providing replacement cryogen to the cryogenic imaging device.

19. The method as recited in claim 17 wherein actively maintaining comprises providing operating power to a cryogen cooling system of the cryogenic imaging device.

20. The method as recited in claim 17, wherein actively maintaining comprises monitoring conditions of the imaging device while at the third facility.

21. The method as recited in claim 17, comprising maintaining the cryogenic device in a superconductive state.

22. The method as recited in claim 17, wherein the first and second transportation providers are the same.

23. The method as recited in claim 17, wherein actively maintaining comprises providing commands to a cryogen cooling system of the cryogenic imaging device.

24. The method as recited in claim 17, wherein the third facility is located proximate to a transportation hub.

25. The method as recited in claim 17, comprising determining if the second facility is prepared to receive the cryogenic imaging device prior to providing the imaging device to the second transportation provider.

26. The method as recited in claim 17, comprising estimating a travel time for transportation of the cryogenic imaging device to the second facility from the third facility prior to providing the imaging device to the second transportation provider.

27. The method as recited in claim 26, comprising providing the cryogenic imaging device to the second transportation provider such that the estimated travel time is within a pre-determined time period.

28. A system for use with a cryogenic imaging device during transport from a first facility to a second facility, comprising:
means for actively maintaining cryogen within the cryogenic imaging device within predetermined parameters via resources of an intermediate facility located on a route of travel between the first facility and the second facility.

29. A computer program for use with a cryogenic imaging device located at a first facility, wherein the first facility is located at an intermediate point on a route of travel between a second facility and a third facility, the computer program being located on one or more tangible media, comprising:
code for actively maintaining cryogen within the cryogenic imaging device within predetermined parameters via resources of the first facility.

30. A maintenance system for use during transportation of a cryogenic imaging device from a first facility to a second facility, comprising:
a third facility located at an intermediate point on a route of travel between the first facility and the second facility, wherein the third facility is configured to actively maintain cryogen in the cryogenic imaging device within predetermined parameters.

31. The maintenance system as recited in claim 30, wherein the third facility is located proximate to a transportation hub.

32. The maintenance system as recited in claim 30, wherein the third facility includes a supply of cryogen for the cryogenic imaging device.

33. The maintenance system as recited in claim 30, wherein the third facility is configured to provide operational power to a cryogen cooling system of the cryogenic imaging device.

34. The maintenance system as recited in claim 30, wherein the third facility is configured to monitor conditions of the cryogenic imaging device.

35. The maintenance system as recited in claim 30 wherein the third facility is configured to provide command instructions to the cryogenic imaging device.

36. The maintenance system as recited in claim 30 wherein the third facility is configured to communicate information regarding the cryogenic imaging device to a remote location via a network.

37. A method of transporting a device having a cryogen from a first facility to a second facility, comprising actively maintaining the cryogen in the device within pre-determined parameters during at least of portion of a route of travel of the device from the first facility to the second facility via resources of a third facility located on the route at a point intermediate the first and second facilities.

38. The method as recited in claim 1, wherein the device comprises the cryogenically cooled magnet.

39. The method as recited in claim 1, wherein the device comprises the medical diagnostic device.

40. The method as recited in claim 1, wherein the device comprises the cryogenically cooled superconductive device.

41. The method as recited in claim 1, wherein actively maintaining comprises providing operating power to a cryogen cooling system of the device.

42. The apparatus as recited in claim 12, wherein the portable resource supply is configured to provide operational power to the cryogenic cooling system.

43. The system as recited in claim 28, wherein the means for actively maintaining comprises providing operating power to the cryogenic imaging device.

44. The computer program as recited in claim 29, wherein the third facility is configured to provide operational power to a cryogen cooling system of the cryogenic imaging device.

* * * * *